(12) United States Patent
Aitken et al.

(10) Patent No.: US 9,643,883 B2
(45) Date of Patent: May 9, 2017

(54) FUSION FORMABLE ALKALI-FREE INTERMEDIATE THERMAL EXPANSION COEFFICIENT GLASS

(71) Applicant: Corsam Technologies LLC, Corning, NY (US)

(72) Inventors: Bruce Gardiner Aitken, Corning, NY (US); James Edward Dickinson, Corning, NY (US); Timothy James Kiczenski, Corning, NY (US); John Christopher Mauro, Corning, NY (US); Adama Tandia, Nelson, PA (US)

(73) Assignee: Corsam Technologies LLC, Corning, NY (US)

( * ) Notice: Subject to any disclaimer, the term of this patent is extended or adjusted under 35 U.S.C. 154(b) by 0 days.

(21) Appl. No.: 14/615,916

(22) Filed: Feb. 6, 2015

(65) Prior Publication Data

US 2015/0158758 A1  Jun. 11, 2015

Related U.S. Application Data

(63) Continuation of application No. 13/569,756, filed on Aug. 8, 2012, now Pat. No. 8,975,199.

(60) Provisional application No. 61/522,956, filed on Aug. 12, 2011.

(51) Int. Cl.
| | |
|---|---|
| *C03C 3/091* | (2006.01) |
| *C03C 3/093* | (2006.01) |
| *C03C 3/097* | (2006.01) |
| *C03C 3/087* | (2006.01) |
| *C03C 17/34* | (2006.01) |
| *C03C 17/36* | (2006.01) |
| *H01L 31/0392* | (2006.01) |
| *H01L 31/048* | (2014.01) |
| *C03C 3/095* | (2006.01) |

(52) U.S. Cl.
CPC .............. *C03C 3/097* (2013.01); *C03C 3/087* (2013.01); *C03C 3/091* (2013.01); *C03C 3/093* (2013.01); *C03C 3/095* (2013.01); *C03C 17/3429* (2013.01); *C03C 17/3678* (2013.01); *H01L 31/03923* (2013.01); *H01L 31/03925* (2013.01); *H01L 31/0488* (2013.01); *Y02E 10/541* (2013.01); *Y02P 70/521* (2015.11)

(58) Field of Classification Search
CPC .................................. C03C 3/091; C03C 3/093
See application file for complete search history.

(56) References Cited

U.S. PATENT DOCUMENTS

| | | |
|---|---|---|
| 4,012,263 A | 3/1977 | Shell |
| 4,536,607 A | 8/1985 | Wiesmann |
| 4,824,808 A | 4/1989 | Dumbaugh, Jr. |
| 4,994,415 A | 2/1991 | Imai et al. |
| 5,116,787 A | 5/1992 | Dumbaugh, Jr. |
| 5,116,788 A | 5/1992 | Dumbaugh, Jr. |
| 5,244,847 A | 9/1993 | Kushitani et al. |
| 5,326,730 A | 7/1994 | Dumbaugh, Jr. et al. |
| 5,348,916 A | 9/1994 | Kushitani et al. |
| 5,374,595 A | 12/1994 | Dumbaugh, Jr. et al. |
| 5,508,237 A | 4/1996 | Moffatt et al. |
| 5,631,195 A | 5/1997 | Yanagisawa et al. |
| 5,770,535 A | 6/1998 | Brix et al. |
| 5,780,373 A | 7/1998 | Yanagisawa et al. |
| 5,801,109 A | 9/1998 | Nishizawa et al. |
| 5,811,361 A | 9/1998 | Miwa |
| 5,885,914 A | 3/1999 | Nishizawa et al. |
| 5,908,703 A | 6/1999 | Brix et al. |
| 5,908,794 A | 6/1999 | Maeda et al. |
| 5,925,583 A | 7/1999 | Yoshii et al. |
| 6,060,168 A | 5/2000 | Kohli |
| 6,096,670 A | 8/2000 | Lautenschlager et al. |
| 6,137,048 A | 10/2000 | Wu et al. |
| 6,162,749 A | 12/2000 | Brocheton et al. |
| 6,169,047 B1 | 1/2001 | Nishizawa et al. |
| 6,187,150 B1 | 2/2001 | Yoshimi et al. |
| 6,207,603 B1 | 3/2001 | Danielson et al. |
| 6,268,304 B1 | 7/2001 | Maeda et al. |
| 6,319,867 B1 | 11/2001 | Chacon et al. |
| 6,329,310 B1 | 12/2001 | Peuchert et al. |
| 6,417,124 B1 | 7/2002 | Peuchert et al. |
| 6,465,381 B1 | 10/2002 | Lautenschlager et al. |
| RE37,920 E | 12/2002 | Moffatt et al. |
| 6,664,203 B2 | 12/2003 | Nagashima et al. |
| 6,671,026 B2 | 12/2003 | Peuchert et al. |
| 6,680,266 B1 | 1/2004 | Peuchert et al. |
| 6,707,526 B2 | 3/2004 | Peuchert et al. |
| 6,818,576 B2 | 11/2004 | Ikenishi et al. |
| 6,858,552 B2 | 2/2005 | Peuchert |
| RE38,959 E | 1/2006 | Kohli |
| 6,992,030 B2 | 1/2006 | Paulson |
| 7,019,207 B2 | 3/2006 | Harneit et al. |
| 7,087,541 B2 | 8/2006 | Kohli |
| 7,153,797 B2 | 12/2006 | Peuchert |
| 7,157,392 B2 | 1/2007 | Peuchert et al. |
| 7,211,957 B2 | 5/2007 | Bergmann et al. |
| 7,235,736 B1 | 6/2007 | Buller et al. |
| 7,297,868 B2 | 11/2007 | Bhattacharya |
| RE41,127 E | 2/2010 | Kohli |

(Continued)

FOREIGN PATENT DOCUMENTS

| | | |
|---|---|---|
| CN | 101074146 A | 11/2007 |
| CN | 101117270 | 11/2007 |

(Continued)

OTHER PUBLICATIONS

Search Report in corresponding Chinese application 201280037518.1, Aug. 5, 2015, 2 pgs.
TW101129009 Search Report Dated Jan. 27, 2016.

*Primary Examiner* — Elizabeth A Bolden
(74) *Attorney, Agent, or Firm* — Harness, Dickey & Pierce, P.L.C.

(57) ABSTRACT

A compositional range of high strain point and/or intermediate expansion coefficient alkali metal free aluminosilicate and boroaluminosilicate glasses are described herein. The glasses can be used as substrates or superstrates for photovoltaic devices, for example, thin film photovoltaic devices such as CdTe or CIGS photovoltaic devices or crystalline silicon wafer devices. These glasses can be characterized as having strain points ≥600° C., thermal expansion coefficient of from 35 to $50 \times 10^{-7}/°$ C.

13 Claims, 1 Drawing Sheet

(56) References Cited

U.S. PATENT DOCUMENTS

| | | |
|---|---|---|
| 7,666,511 B2 | 2/2010 | Ellison et al. |
| 7,670,975 B2 | 3/2010 | Suzuki et al. |
| 7,727,916 B2 | 6/2010 | Peuchert et al. |
| 7,754,631 B2 | 7/2010 | Maehara et al. |
| 7,833,919 B2 | 11/2010 | Danielson et al. |
| 8,399,370 B2 | 3/2013 | Niida et al. |
| 8,598,056 B2 | 12/2013 | Ellison et al. |
| 8,835,335 B2 | 9/2014 | Murata et al. |
| 2001/0034293 A1 | 10/2001 | Peuchert et al. |
| 2001/0034294 A1 | 10/2001 | Peuchert et al. |
| 2002/0011080 A1* | 1/2002 | Naka .................. C03C 3/091 65/66 |
| 2002/0013210 A1 | 1/2002 | Peuchert et al. |
| 2002/0151426 A1* | 10/2002 | Murata .................. C03C 3/091 501/66 |
| 2002/0183188 A1 | 12/2002 | Peuchert |
| 2003/0087746 A1 | 5/2003 | Ritter et al. |
| 2004/0070327 A1 | 4/2004 | Bergmann et al. |
| 2004/0220039 A1 | 11/2004 | Peuchert |
| 2006/0003884 A1 | 1/2006 | Nishizawa et al. |
| 2006/0006786 A1 | 1/2006 | Fechner et al. |
| 2006/0010917 A1 | 1/2006 | Fechner et al. |
| 2006/0038228 A1 | 2/2006 | Aitken et al. |
| 2006/0293162 A1 | 12/2006 | Ellison |
| 2007/0027019 A1 | 2/2007 | Nishizawa et al. |
| 2007/0191207 A1 | 8/2007 | Danielson et al. |
| 2007/0193623 A1 | 8/2007 | Krasnov |
| 2008/0020919 A1 | 1/2008 | Murata |
| 2008/0076656 A1* | 3/2008 | Suzuki .................. C03B 5/225 501/53 |
| 2008/0127679 A1 | 6/2008 | Nishizawa et al. |
| 2008/0128020 A1 | 6/2008 | Zafar et al. |
| 2008/0130171 A1 | 6/2008 | Behan et al. |
| 2008/0206494 A1 | 8/2008 | Kurachi et al. |
| 2008/0308146 A1 | 12/2008 | Krasnov et al. |
| 2009/0103040 A1* | 4/2009 | Shimizu .................. C03C 3/078 349/158 |
| 2009/0176038 A1 | 7/2009 | Komori et al. |
| 2009/0176640 A1* | 7/2009 | Maehara .................. C03C 3/091 501/66 |
| 2009/0226671 A1 | 9/2009 | Yanase et al. |
| 2009/0239008 A1 | 9/2009 | Ovutthitham |
| 2009/0266111 A1 | 10/2009 | Nagashima et al. |
| 2009/0270242 A1 | 10/2009 | Yanase et al. |
| 2009/0275462 A1 | 11/2009 | Murata |
| 2009/0286091 A1 | 11/2009 | Danielson et al. |
| 2009/0294773 A1 | 12/2009 | Ellison |
| 2010/0084016 A1 | 4/2010 | Aitken |
| 2010/0288351 A1 | 11/2010 | Speit et al. |
| 2010/0288361 A1 | 11/2010 | Rudigier-Voigt et al. |
| 2011/0048074 A1 | 3/2011 | Danielson et al. |
| 2012/0132282 A1* | 5/2012 | Aitken .................. C03C 3/062 136/260 |
| 2013/0225390 A1 | 8/2013 | Ellison et al. |
| 2013/0255779 A1 | 10/2013 | Aitken et al. |
| 2013/0296157 A1 | 11/2013 | Ellison et al. |

FOREIGN PATENT DOCUMENTS

| | | |
|---|---|---|
| CN | 101489944 | 7/2009 |
| EP | 0396896 A1 | 11/1990 |
| EP | 0607865 A1 | 7/1994 |
| EP | 0672629 A2 | 9/1995 |
| EP | 1878709 A1 | 1/2008 |
| FR | 2759077 A1 | 8/1998 |
| JP | 08-133778 | 5/1996 |
| JP | 2743333 B2 | 4/1998 |
| JP | 10-152339 | 6/1998 |
| JP | 11-135819 | 5/1999 |
| JP | 11-180727 | 6/1999 |
| JP | 11180728 | 7/1999 |
| JP | 11-310433 | 11/1999 |
| JP | 11314933 | 11/1999 |
| JP | 11335133 | 12/1999 |
| JP | 2002025762 A | 1/2002 |
| JP | 2002053340 A | 2/2002 |
| JP | 2002198504 A | 7/2002 |
| JP | 2003261352 A | 9/2003 |
| JP | 2003335546 A | 11/2003 |
| JP | 2004035295 A | 2/2004 |
| JP | 2004238283 A | 8/2004 |
| JP | 2004244257 A | 9/2004 |
| JP | 2006188406 A | 7/2006 |
| JP | 2007246365 A | 9/2007 |
| JP | 2007284307 | 11/2007 |
| JP | 2008069021 A | 3/2008 |
| JP | 2008280189 A | 11/2008 |
| JP | 2008308343 A | 12/2008 |
| TW | 200927686 | 7/2009 |
| WO | 9827019 | 6/1998 |
| WO | 02076899 A1 | 10/2002 |
| WO | 2006137683 A1 | 12/2006 |
| WO | 2007052489 A1 | 5/2007 |
| WO | 2008028599 A1 | 3/2008 |

* cited by examiner

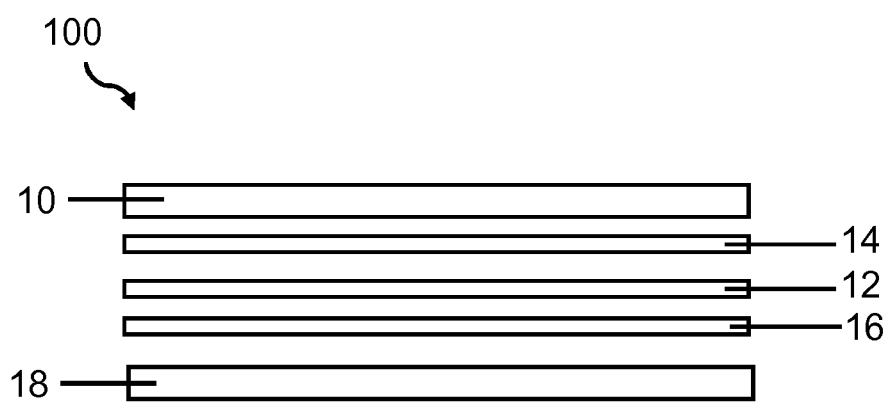

FUSION FORMABLE ALKALI-FREE INTERMEDIATE THERMAL EXPANSION COEFFICIENT GLASS

This application is a continuation Application of U.S. patent application Ser. No. 13/569,756 filed on Aug. 8, 2012 which claims the benefit of priority under 35 U.S.C. §119 of U.S. Provisional Application Ser. No. 61/522,956 filed on Aug. 12, 2011 the entire disclosure of each is relied upon and incorporated herein by reference in their entirety.

BACKGROUND

Field

Embodiments relate generally to alkali-free glasses and more particularly to alkali-free, high strain point and/or intermediate expansion coefficient, fusion formable aluminosilicate, and/or boroaluminosilicate glasses which may be useful in photovoltaic applications, for example, thin film photovoltaic devices.

Technical Background

Substrate glasses for copper indium gallium diselenide (CIGS) photovoltaic modules typically contain $Na_2O$, as diffusion of Na from the glass into the CIGS layer has been shown to result in significant improvement in module efficiency. However, due to the difficulty in controlling the amount of diffusing Na during the CIGS deposition/crystallization process, some manufacturers of these devices prefer to deposit a layer of a suitable Na compound, e.g. NaF, prior to CIGS deposition, in which case any alkali present in the substrate glass needs to be contained through the use of a barrier layer. Moreover, in the case of cadmium telluride (CdTe) photovoltaic modules, any Na contamination of the CdTe layer is deleterious to module efficiency and, therefore, typical Na-containing substrate glasses, e.g. soda-lime glass, require the presence of a barrier layer. Consequently, use of an alkali-free substrate glass for either CIGS, silicon, wafered crystalline silicon, or CdTe modules can obviate the need for a barrier layer.

SUMMARY

The intermediate thermal expansion coefficient and/or the alkali-free glasses disclosed herein are especially compatible with CdTe photovoltaic devices and may increase the efficiency of the cell.

One embodiment is a glass comprising, in mole percent:
  55 to 75 percent $SiO_2$;
  5 to 20 percent $Al_2O_3$;
  0 to 15 percent $B_2O_3$;
  0 to 10 percent MgO;
  0 to 15 percent SrO;
  0 to 16 percent CaO; and
  0 to 9 percent BaO.
wherein MgO+CaO+BaO+SrO is 13 to 20 percent, wherein the glass is substantially free of alkali metal, and wherein the glass has a liquidus viscosity of 100,000 poise or greater.

These glasses are advantageous materials to be used in copper indium gallium diselenide (CIGS) photovoltaic modules where the sodium required to optimize cell efficiency is not to be derived from the substrate glass but instead from a separate deposited layer consisting of a sodium containing material such as NaF. Current CIGS module substrates are typically made from soda-lime glass sheet that has been manufactured by the float process. However, use of higher strain point glass substrates can enable higher temperature CIGS processing, which is expected to translate into desirable improvements in cell efficiency.

Accordingly, the alkali-free glasses described herein can be characterized by strain points $\geq 600°$ C. and thermal expansion coefficients in the range of from 35 to $50 \times 10^{-7}/°$ C., in order to minimize thermal expansion mismatch between the substrate and CIGS layer or to better match the thermal expansion of CdTe.

Finally, the preferred compositions of this disclosure have strain point well in excess of 650° C., thereby enabling CIGS or CdTe deposition/crystallization to be carried out at the highest possible processing temperature, resulting in additional efficiency gain.

Additional features and advantages will be set forth in the detailed description which follows, and in part will be readily apparent to those skilled in the art from the description or recognized by practicing the invention as described in the written description and claims hereof.

It is to be understood that both the foregoing general description and the following detailed description are merely exemplary of the invention, and are intended to provide an overview or framework for understanding the nature and character of the invention as it is claimed.

The accompanying drawing is included to provide a further understanding of the invention, and is incorporated in and constitutes a part of this specification. The drawing illustrates one or more embodiment(s) of the invention and together with the description serve to explain the principles and operation of the invention.

BRIEF DESCRIPTION OF THE DRAWINGS

The invention can be understood from the following detailed description either alone or together with the accompanying drawing FIGURE.

The FIGURE is a schematic of features of a photovoltaic device according to some embodiments.

DETAILED DESCRIPTION

Reference will now be made in detail to various embodiments of the invention.

As used herein, the term "substrate" can be used to describe either a substrate or a superstrate depending on the configuration of the photovoltaic cell. For example, the substrate is a superstrate, if when assembled into a photovoltaic cell, it is on the light incident side of a photovoltaic cell. The superstrate can provide protection for the photovoltaic materials from impact and environmental degradation while allowing transmission of the appropriate wavelengths of the solar spectrum. Further, multiple photovoltaic cells can be arranged into a photovoltaic module. Photovoltaic device can describe either a cell, a module, or both.

As used herein, the term "adjacent" can be defined as being in close proximity. Adjacent structures may or may not be in physical contact with each other. Adjacent structures can have other layers and/or structures disposed between them.

Moreover, where a range of numerical values is recited herein, comprising upper and lower values, unless otherwise stated in specific circumstances, the range is intended to include the endpoints thereof, and all integers and fractions within the range. It is not intended that the scope of the invention be limited to the specific values recited when defining a range. Further, when an amount, concentration, or other value or parameter is given as a range, one or more preferred ranges or a list of upper preferable values and lower preferable values, this is to be understood as specifically disclosing all ranges formed from any pair of any upper range limit or preferred value and any lower range limit or preferred value, regardless of whether such pairs are separately disclosed. Finally, when the term "about" is used in describing a value or an end-point of a range, the disclosure should be understood to include the specific value or end-point referred to.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such.

The term "or", as used herein, is inclusive; more specifically, the phrase "A or B" means "A, B, or both A and B". Exclusive "or" is designated herein by terms such as "either A or B" and "one of A or B", for example.

The indefinite articles "a" and "an" are employed to describe elements and components of the invention. The use of these articles means that one or at least one of these elements or components is present. Although these articles are conventionally employed to signify that the modified noun is a singular noun, as used herein the articles "a" and "an" also include the plural, unless otherwise stated in specific instances. Similarly, the definite article "the", as used herein, also signifies that the modified noun may be singular or plural, again unless otherwise stated in specific instances.

It is noted that one or more of the claims may utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

As used herein, a glass composition having 0 wt % of a compound is defined as meaning that the compound, molecule, or element was not purposefully added to the composition, but the composition may still comprise the compound, typically in tramp or trace amounts. Similarly, "substantially free of alkali metal", "substantially free of sodium", "substantially free of potassium", "sodium-free," "alkali-free," "potassium-free" or the like are defined to mean that the compound, molecule, or element was not purposefully added to the composition, but the composition may still comprise sodium, alkali, or potassium, but in approximately tramp or trace amounts. These tramp amounts are not intentionally included in the batch but may be present in minor amounts as impurities in the raw materials used to provide the major components of the glass.

One embodiment is a glass comprising, in mole percent:
55 to 75 percent $SiO_2$;
5 to 20 percent $Al_2O_3$;
0 to 15 percent $B_2O_3$;
0 to 10 percent MgO;
0 to 15 percent SrO;
0 to 16 percent CaO; and
0 to 9 percent BaO.
wherein MgO+CaO+BaO+SrO is 13 to 20 percent, wherein the glass is substantially free of alkali metal, and wherein the glass has a liquidus viscosity of 100,000 poise or greater.

In one embodiment, the glass, comprises, in mole percent:
55 to 75 percent $SiO_2$;
5 to 13 percent $Al_2O_3$;
0 to 15 percent $B_2O_3$;
0 to 10 percent MgO;
0 to 15 percent SrO;
0 to 16 percent CaO; and
0 to 9 percent BaO.

In one embodiment, the glass, comprises, in mole percent:
55 to 75 percent $SiO_2$;
0 to 20 percent $Al_2O_3$;
6 to 12 percent $B_2O_3$;
0 to 10 percent MgO;
0 to 15 percent SrO;
0 to 16 percent CaO; and
0 to 9 percent BaO.

In one embodiment, the glass, comprises, in mole percent:
55 to 75 percent $SiO_2$;
5 to 13 percent $Al_2O_3$;
6 to 12 percent $B_2O_3$;
0 to 10 percent MgO;
0 to 15 percent SrO;
0 to 16 percent CaO; and
0 to 9 percent BaO.

In one embodiment, the glass, comprises, in mole percent:
55 to 75 percent $SiO_2$;
8 to 13 percent $Al_2O_3$;
6 to 12 percent $B_2O_3$;
0 to 7 percent MgO;
0 to 12 percent SrO;
0 to 16 percent CaO; and
0 to 9 percent BaO.

In one embodiment, the glass, comprises, in mole percent:
58 to 69 percent $SiO_2$;
8 to 13 percent $Al_2O_3$;
6 to 12 percent $B_2O_3$;
0 to 7 percent MgO;
0 to 12 percent SrO;
0 to 16 percent CaO; and
0 to 9 percent BaO.

In one embodiment, the glass, comprises, in mole percent:
73 to 75 percent $SiO_2$;
6 to 9 percent $Al_2O_3$;
0 percent $B_2O_3$;
1 to 3 percent MgO;
0 percent SrO;
13 to 16 percent CaO; and
1 to 3 percent BaO.

In one embodiment, the glass, comprises, in mole percent:
60 to 67 percent $SiO_2$;
8 to 12 percent $Al_2O_3$;
6 to 12 percent $B_2O_3$;
0.05 to 7 percent MgO;
0 to 12 percent SrO;
0.5 to 9 percent CaO; and
0.5 to 8 percent BaO.

The glass is substantially free of alkali metal, for example, the content of alkali can be 0.05 mole percent or less, for example, zero mole percent. The glass, according to some embodiments, is free of intentionally added alkali metal.

The glass is substantially free of sodium, for example, the content of sodium can be 0.05 mole percent or less, for example, zero mole percent. The glass, according to some embodiments, is free of intentionally added sodium.

The glass is substantially free of potassium, for example, the content of sodium can be 0.05 mole percent or less, for example, zero mole percent. The glass, according to some embodiments, is free of intentionally added potassium.

The glass is substantially free of sodium and potassium, for example, the content of sodium can be 0.05 mole percent or less, for example, zero mole percent. The glass, according to some embodiments, is free of intentionally added sodium and potassium.

In some embodiments, the glass comprises 55 to 75 percent $SiO_2$, for example, 58 to 69 percent $SiO_2$, or, for example, 60 to 67 percent $SiO_2$, or, for example, 73 to 75 percent $SiO_2$.

As mentioned above, the glasses, according some embodiments, comprise 0 to 15 percent $B_2O_3$, for example, 6 to 12 percent. $B_2O_3$ is added to the glass to reduce melting temperature, to decrease liquidus temperature, to increase liquidus viscosity, and to improve mechanical durability relative to a glass containing no $B_2O_3$.

The glass, according to some embodiments, comprises MgO+CaO+BaO+SrO in an amount from 13 to 20 mole percent. MgO can be added to the glass to reduce melting temperature and to increase strain point. It can disadvantageously lower CTE relative to other alkaline earths (e.g., CaO, SrO, BaO), and so other adjustments may be made to keep the CTE within the desired range. Examples of suitable adjustments include increase SrO at the expense of CaO.

The glasses can comprise, in some embodiments, 0 to 15 mole percent SrO, for example, greater than zero to 15 mole percent, for example, 1 to 12 mole percent SrO. In certain embodiments, the glass contains no deliberately batched SrO, though it may of course be present as a contaminant in other batch materials. SrO contributes to higher coefficient of thermal expansion, and the relative proportion of SrO and CaO can be manipulated to improve liquidus temperature, and thus liquidus viscosity. SrO is not as effective as CaO or MgO for improving strain point, and replacing either of these with SrO tends to cause the melting temperature to increase. BaO has a similar effect coefficient of thermal expansion as SrO, if not a greater effect. BaO tends to lower melting temperature and lower liquidus temperature The glasses, in some embodiments, comprise 0 to 16 mole percent CaO, for example, greater than 0 to 15 or, for example, 0 to 12 mole percent CaO, for example, 0.5 to 9 mole percent CaO. CaO contributes to higher strain point, lower density, and lower melting temperature.

The glass, according to one embodiment, further comprises 0 to 0.5 mole percent of a fining agent. The fining agent can be $SnO_2$.

The glass, according to one embodiment, further comprising 0 to 2 mole percent of $TiO_2$, MnO, ZnO, $Nb_2O_5$, $Ta_2O_5$, $ZrO_2$, $La_2O_3$, $Y_2O_3$, $P_2O_5$, or a combination thereof. These optional components can be used to further tailor glass properties.

In some embodiments, the glass is substantially free of $Sb_2O_3$, $As_2O_3$, or combinations thereof, for example, the glass comprises 0.05 mole percent or less of $Sb_2O_3$ or $As_2O_3$ or a combination thereof. For example, the glass can comprise zero mole percent of $Sb_2O_3$ or $As_2O_3$ or a combination thereof.

Accordingly, in one embodiment, the glass has a strain point of 600° C. or greater, for example, 610° C. or greater, for example, 620° C. or greater, for example, 630° C. or greater, for example, 640° C. or greater, for example, 650° C. or greater. In some embodiments, the glass has a coefficient of thermal expansion of from $35 \times 10^{-7}$/° C. to $50 \times 10^{-7}$/° C., for example, $39 \times 10^{-7}$/° C. to $50 \times 10^{-7}$/° C. In one embodiment, the glass has a coefficient of thermal expansion of from $35 \times 10^{-7}$/° C. to $50 \times 10^{-7}$/° C. and a strain point of 600° C. or greater.

The glass can be fusion formed as known in the art of fusion forming glass. The fusion draw process uses an isopipe that has a channel for accepting molten glass raw material. The channel has weirs that are open at the top along the length of the channel on both sides of the channel. When the channel fills with molten material, the molten glass overflows the weirs. Due to gravity, the molten glass flows down the outside surfaces of the isopipe. These outside surfaces extend down and inwardly so that they join at an edge below the drawing tank. The two flowing glass surfaces join at this edge to fuse and form a single flowing sheet. The fusion draw method offers the advantage that, since the two glass films flowing over the channel fuse together, neither outside surface of the resulting glass sheet comes in contact with any part of the apparatus. Thus, the surface properties are not affected by such contact.

Glasses having a liquidus viscosity of greater than or equal to 100 kP, 100,000 poise, are usually fusion formable. Glass having a liquidus viscosity in the range of from 10 kP to less than 100 kP are usually float formable but not fusion formable. Some embodiments are alkali-free glasses with Tstr>630° C., α in the range of 4-5 ppm/° C., as well as liquidus viscosity (ηliq) in excess of 100,000 poise. As such, they are ideally suited for being formed into sheet by the fusion process. Moreover, many of these glasses also have a 200 poise temperature ($T_{200}$) that is well below 1550° C., making them ideal candidates for lower-cost versions of the fusion process.

In one embodiment, the glass is in the form of a sheet. The glass in the form of a sheet can be strengthened, for example, thermally tempered.

The glass, according to one embodiment, is optically transparent.

In one embodiment, as shown in the FIGURE, a photovoltaic device 100 comprises the glass in the form of a sheet 10. The photovoltaic device can comprise more than one of the glass sheets, for example, as a substrate and/or as a superstrate. In one embodiment, the photovoltaic device 100 comprises the glass sheet as a substrate or superstrate 10 or 18, a conductive material 12 adjacent to the substrate, and an active photovoltaic medium 16 adjacent to the conductive material. In one embodiment, the device comprises two glass sheets, one as the superstrate and one as the substrate, having the compositions described herein. The functional layer can comprise copper indium gallium diselenide, amorphous silicon, crystalline silicon, one or more crystalline silicon wafers, cadmium telluride, or combinations thereof adjacent to the substrate or superstrate. In one embodiment, the active photovoltaic medium comprises a CIGS layer. In one embodiment, the active photovoltaic medium comprises a cadmium telluride (CdTe) layer. In one embodiment, the photovoltaic device comprises a functional layer comprising copper indium gallium diselenide or cadmium telluride. In one embodiment, the photovoltaic device the functional layer is copper indium gallium diselenide. In one embodiment, the functional layer is cadmium telluride.

The photovoltaic device 100, according to one embodiment, further comprises one or more intermediate layer(s) 14 such as a sodium containing layer, for example, a layer comprising NaF or a barrier layer disposed between or adjacent to the superstrate or substrate and the functional layer. In one embodiment, the photovoltaic device further comprises a barrier layer disposed between or adjacent to the superstrate or substrate and a transparent conductive oxide (TCO) layer, wherein the TCO layer is disposed between or adjacent to the functional layer and the barrier layer. A TCO may be present in a photovoltaic device comprising a CdTe functional layer. In one embodiment, the barrier layer is disposed directly on the glass. In one embodiment, the device comprises multiple intermediate layers such as a sodium containing layer, for example, a layer comprising NaF, and an adjacent sodium metering layer located between the superstrate and the substrate.

In one embodiment, the glass sheet is optically transparent. In one embodiment, the glass sheet as the substrate and/or superstrate is optically transparent.

According to some embodiments, the glass sheet has a thickness of 4.0 mm or less, for example, 3.5 mm or less, for example, 3.2 mm or less, for example, 3.0 mm or less, for example, 2.5 mm or less, for example, 2.0 mm or less, for example, 1.9 mm or less, for example, 1.8 mm or less, for example, 1.5 mm or less, for example, 1.1 mm or less, for example, 0.5 mm to 2.0 mm, for example, 0.5 mm to 1.1 mm, for example, 0.7 mm to 1.1 mm. Although these are exemplary thicknesses, the glass sheet can have a thickness of any numerical value including decimal places in the range of from 0.1 mm up to and including 4.0 mm.

Alkali-free glasses are becoming increasingly attractive candidates for the superstrate, substrate of CdTe, CIGS modules, respectively. In the former case, alkali contamination of the CdTe and conductive oxide layers of the film stack is avoided. Moreover, process simplification arises from the elimination of the barrier layer (needed, e.g., in the case of conventional soda-lime glass). In the latter case, CIGS module manufacturers are better able to control the amount of Na needed to optimize absorber performance by depositing a separate Na-containing layer that, by virtue of its specified composition and thickness, results in more reproducible Na delivery to the CIGS layer.

EXAMPLES

Table 1, Table 2, Table 3, Table 4, Table 5, Table 6, and Table 7 show exemplary glasses, according to embodiments of the invention. Properties data for some exemplary glasses are also shown in Table 1, Table 2, Table 3, Table 4, Table 5, Table 6, and Table 7. In the Tables $T_{str}$(° C.) is the strain point which is the temperature when the viscosity is equal to $10^{14.7}$ P as measured by beam bending or fiber elongation. $\alpha(10^{-7}/°$ C.) in the Tables is the coefficient of thermal expansion (CTE) which is the amount of dimensional change from either 0 to 300° C. or 25 to 300° C. depending on the measurement. CTE is typically measured by dilatometry. $\rho$(g/cc) is the density which is measured with the Archimedes method (ASTM C693). $T_{200}$(° C.) is the two-hundred Poise (P) temperature. This is the temperature when the viscosity of the melt is 200P as measured by HTV (high temperature viscosity) measurement which uses concentric cylinder viscometry. $T_{liq}$(° C.) is the liquidus temperature. This is the temperature where the first crystal is observed in a standard gradient boat liquidus measurement (ASTM C829-81). $\rho_{liq}$ is the liquidus viscosity expressed in kilopoise; thus 100 kP=100,000 P. This is the viscosity of the melt corresponding to the liquidus temperature.

TABLE 1

| Mole % | Example | | | | | | | | | |
|---|---|---|---|---|---|---|---|---|---|---|
| | 1 | 2 | 3 | 4 | 5 | 6 | 7 | 8 | 9 | 10 |
| MgO | 6.4 | 6.9 | 6.9 | 4.6 | 4.8 | 6.4 | 4.4 | 4.4 | 2.7 | 2.6 |
| CaO | 8.5 | 6.9 | 9.1 | 5.4 | 5.6 | 5.2 | 7.2 | 5.2 | 2.9 | 2.0 |
| SrO | 0 | 0 | 0 | 3.6 | 3.8 | 3.5 | 3.5 | 5.5 | 11.8 | 9.6 |
| BaO | 2.4 | 3.4 | 2.6 | 2.4 | 2.5 | 2.3 | 2.3 | 2.3 | 0.7 | 3.6 |
| RO | 17.2 | 17.2 | 18.6 | 16.0 | 16.7 | 17.4 | 17.4 | 17.4 | 18.0 | 17.7 |
| B$_2$O$_3$ | 10.0 | 10.0 | 10.8 | 10.7 | 11.2 | 10.3 | 10.3 | 10.3 | 9.0 | 7.5 |
| Al$_2$O$_3$ | 11.1 | 11.1 | 12.0 | 11.1 | 11.6 | 10.7 | 10.7 | 10.7 | 9.6 | 9.3 |
| SiO$_2$ | 61.5 | 61.5 | 58.5 | 62.0 | 60.5 | 61.5 | 61.5 | 61.5 | 63.3 | 65.4 |
| SnO$_2$ | 0.10 | 0.10 | 0.10 | 0.10 | 0.10 | 0.10 | 0.10 | 0.10 | 0.10 | 0.10 |
| Tstr | 645 | 642 | 641 | 643 | 641 | 642 | 641 | 642 | 645 | 649 |
| α | 41.8 | 40.6 | 41.5 | 40.7 | 41.2 | 40.0 | 41.0 | 41.9 | 46.2 | 46.5 |
| ρ | 2.53 | 2.56 | 2.56 | 2.57 | 2.59 | 2.58 | 2.58 | 2.62 | 2.70 | 2.75 |
| T200 | 1473 | | | 1490 | 1515 | | | | | |
| Tliq | 1060 | 1065 | 1050 | 1015 | 1020 | 1070 | 1040 | 1035 | 1130 | 1110 |
| ηliq (kP) | 205 | | | 777 | 459 | | | | | |

TABLE 2

| Mole % | Example | | | | | | | | | |
|---|---|---|---|---|---|---|---|---|---|---|
| | 11 | 12 | 13 | 14 | 15 | 16 | 17 | 18 | 19 | 20 |
| MgO | 4.1 | 5.4 | 1.8 | 0 | 2.0 | 4.4 | 6.4 | 5.4 | 5.4 | 6.4 |
| CaO | 9.9 | 6.4 | 11.0 | 10.0 | 9.0 | 8.5 | 6.5 | 7.5 | 7.5 | 7.5 |
| SrO | 3.3 | 4.3 | 2.9 | 9.0 | 8.0 | 2.0 | 2.0 | 1.0 | 1.0 | 0 |
| BaO | 2.2 | 2.8 | 3.3 | 0 | 0 | 2.4 | 2.4 | 3.4 | 3.4 | 3.4 |
| RO | 19.4 | 19.0 | 19.0 | 19.0 | 19.0 | 17.3 | 17.3 | 17.3 | 17.3 | 17.3 |
| B$_2$O$_3$ | 9.7 | 10.7 | 10.7 | 8.0 | 8.0 | 10.0 | 10.0 | 10.0 | 9.0 | 9.0 |
| Al$_2$O$_3$ | 10.0 | 11.1 | 8.5 | 9.0 | 9.0 | 11.1 | 11.1 | 11.1 | 12.1 | 12.1 |
| SiO$_2$ | 60.8 | 59.0 | 62.3 | 64.0 | 64.0 | 61.5 | 61.5 | 61.5 | 61.5 | 61.5 |
| SnO$_2$ | 0.10 | 0.10 | 0.07 | 0.10 | 0.10 | 0.10 | 0.10 | 0.10 | 0.10 | 0.10 |
| Tstr | 639 | 636 | 631 | 648 | 649 | 650 | 645 | 650 | 659 | 661 |
| α | 46.5 | 43.9 | 46.0 | 48.4 | 45.8 | 40.4 | 41.4 | 39.5 | 40.3 | 39.8 |

TABLE 2-continued

| Mole % | Example |  |  |  |  |  |  |  |  |  |
|---|---|---|---|---|---|---|---|---|---|---|
|  | 11 | 12 | 13 | 14 | 15 | 16 | 17 | 18 | 19 | 20 |
| ρ | 2.70 | 2.64 |  | 2.67 | 2.63 | 2.57 | 2.60 | 2.56 | 2.60 | 2.58 |
| T200 |  | 1423 |  |  |  |  |  |  |  |  |
| Tliq | 1045 | 1030 | 1075 | 1150 | 1145 | 1080 | 1080 | 1095 | 1080 | 1090 |
| ηliq (kP) |  | 192 |  |  |  |  |  |  |  |  |

TABLE 3

| Mole % | Example |  |  |  |  |  |  |  |  |  |
|---|---|---|---|---|---|---|---|---|---|---|
|  | 21 | 22 | 23 | 24 | 25 | 26 | 27 | 28 | 29 | 30 |
| MgO | 0.1 | 2.0 | 0 | 0 | 1.98 | 1.97 | 0.07 | 0.07 | 0.06 | 0.06 |
| CaO | 4.3 | 2.0 | 4.3 | 3.3 | 1.3 | 0.8 | 4.6 | 4.6 | 4.5 | 4.6 |
| SrO | 9.7 | 12.0 | 10.0 | 10.5 | 11.9 | 11.5 | 9.7 | 9.6 | 10.2 | 9.5 |
| BaO | 0.1 | 0.1 | 0.1 | 0.1 | 2.0 | 4.0 | 0.1 | 0.1 | 0.1 | 0.1 |
| RO | 14.1 | 16.1 | 14.4 | 13.9 | 17.2 | 18.3 | 14.4 | 14.4 | 14.8 | 14.2 |
| $B_2O_3$ | 8.4 | 6.6 | 8.5 | 8.5 | 6.4 | 6.4 | 9.9 | 11.4 | 9.9 | 11.5 |
| $Al_2O_3$ | 9.3 | 9.3 | 10.0 | 10.5 | 8.7 | 8.6 | 9.3 | 9.3 | 10.0 | 10.0 |
| $SiO_2$ | 68.1 | 67.8 | 67.0 | 67.0 | 67.6 | 66.5 | 66.2 | 64.8 | 65.2 | 64.1 |
| $SnO_2$ | 0.16 | 0.18 | 0.18 | 0.18 | 0.17 | 0.17 | 0.17 | 0.17 | 0.17 | 0.17 |
| Tstr | 668 | 674 | 668 | 673 | 667 | 665 | 658 | 649 | 659 | 656 |
| α | 40.9 | 42.8 | 41.7 | 41.8 | 45.9 | 46.6 | 42.1 | 42.5 | 42.3 | 42.4 |
| ρ | 2.59 | 2.65 | 2.59 | 2.59 | 2.72 | 2.77 | 2.58 | 2.58 | 2.59 | 2.59 |
| T200 | 1595 | 1595 | 1594 | 1610 | 1563 | 1545 | 1569 | 1540 | 1555 | 1528 |
| Tliq | 1125 | 1125 | 1135 | 1150 | 1100 | 1075 | 1075 | 1070 | 1080 | 1080 |
| ηliq (kP) | 142 | 162 | 119 | 121 | 124 | 235 | 274 | 202 | 253 | 163 |

TABLE 4

| Mole % | Example |  |  |  |  |  |  |  |
|---|---|---|---|---|---|---|---|---|
|  | 31 | 32 | 33 | 34 | 35 | 36 | 37 | 38 |
| MgO | 4.7 | 2.5 | 3.5 | 4.5 | 3.8 | 3.9 | 4.2 | 4.4 |
| CaO | 5.6 | 7.0 | 5.5 | 4.5 | 6.0 | 5.7 | 5.6 | 5.5 |
| SrO | 3.7 | 1.5 | 2.0 | 2.0 | 2.2 | 2.5 | 2.9 | 3.3 |
| BaO | 2.5 | 7.0 | 7.0 | 7.0 | 7.6 | 6.2 | 4.9 | 3.7 |
| RO | 16.5 | 18.0 | 18.0 | 18.0 | 19.5 | 18.3 | 17.6 | 16.8 |
| $B_2O_3$ | 11.0 | 9.0 | 9.0 | 9.0 | 9.8 | 9.8 | 10.1 | 10.4 |
| $Al_2O_3$ | 11.4 | 9.0 | 9.0 | 9.0 | 9.8 | 9.9 | 10.3 | 10.8 |
| $SiO_2$ | 61.0 | 63.9 | 63.9 | 63.9 | 60.9 | 62.0 | 62.0 | 62.0 |
| $SnO_2$ | 0.10 | 0.10 | 0.10 | 0.10 | 0.10 | 0.10 | 0.10 | 0.10 |
| Tstr | 640 | 632 | 632 | 635 | 630 | 631 | 633 | 638 |
| α | 41.2 | 46.5 | 45.9 | 45.8 | 48.2 | 46.0 | 43.7 | 41.7 |
| ρ | 2.58 | 2.73 | 2.72 | 2.72 | 2.77 | 2.71 | 2.67 | 2.62 |
| T200 | 1510 | 1490 | 1490 | 1494 | 1443 |  | 1475 | 1490 |
| Tliq | 1000 | 1050 | 1025 | 1020 | 1045 |  | 1000 | 1010 |
| ηliq (kP) | 893 | 166 | 364 | 437 | 106 |  | 756 | 808 |

TABLE 5

| Mole % | Example |  |  |  |  |  |  |  |  |  |
|---|---|---|---|---|---|---|---|---|---|---|
|  | 39 | 40 | 41 | 42 | 43 | 44 | 45 | 46 | 47 | 48 |
| MgO | 1.4 | 1.3 | 1.8 | 0.0 | 2.0 | 4.4 | 6.4 | 5.4 | 5.4 | 6.4 |
| CaO | 15.4 | 14.2 | 11.0 | 10.0 | 9.0 | 8.5 | 6.5 | 7.5 | 7.5 | 7.5 |
| SrO |  |  | 2.9 | 9.0 | 8.0 | 2.0 | 2.0 | 1.0 | 1.0 | 0 |
| BaO | 1.4 | 1.3 | 3.3 | 0 | 0 | 2.4 | 2.4 | 3.4 | 3.4 | 3.4 |
| RO | 18.1 | 16.7 | 19.0 | 19.0 | 19.0 | 17.3 | 17.3 | 17.3 | 17.3 | 17.3 |
| $B_2O_3$ |  |  | 10.7 | 8.0 | 8.0 | 10.0 | 10.0 | 10.0 | 9.0 | 9.0 |

TABLE 5-continued

| Mole % | 39 | 40 | 41 | 42 | 43 | 44 | 45 | 46 | 47 | 48 |
|---|---|---|---|---|---|---|---|---|---|---|
| $Al_2O_3$ | 7.0 | 8.4 | 8.5 | 9.0 | 9.0 | 11.1 | 11.1 | 11.1 | 12.1 | 12.1 |
| $SiO_2$ | 74.9 | 74.9 | 62.3 | 64.0 | 64.0 | 61.5 | 61.5 | 61.5 | 61.5 | 61.5 |
| $SnO_2$ | 0.10 | 0.10 | 0.07 | 0.10 | 0.10 | 0.10 | 0.10 | 0.10 | 0.10 | 0.10 |
| Tstr | 735 | 745 | 613 | 648 | 649 | 650 | 645 | 650 | 659 | 661 |
| α | 42.7 | 40.6 | 46 | 48.4 | 45.8 | 40.4 | 41.4 | 39.5 | 40.3 | 39.8 |
| ρ |  | 2.67 |  | 2.67 | 2.63 | 2.57 | 2.60 | 2.56 | 2.60 | 2.58 |
| T200 |  |  |  |  |  |  |  |  |  |  |
| Tliq | 1080 | 1080 | 1075 | 1150 | 1145 | 1080 | 1080 | 1095 | 1080 | 1090 |
| ηliq (kP) |  |  |  |  |  |  |  |  |  |  |

TABLE 6

| Mole % | 49 | 50 | 51 | 52 | 53 | 54 | 55 | 56 | 57 |
|---|---|---|---|---|---|---|---|---|---|
| MgO | 0.1 | 2.0 | 0.0 | 0.0 | 2.0 | 2.0 | 0.1 | 0.1 | 0.1 |
| CaO | 4.3 | 2.0 | 4.3 | 3.3 | 1.3 | 0.8 | 4.6 | 4.6 | 4.5 |
| SrO | 9.7 | 12.0 | 10.0 | 10.5 | 11.9 | 11.5 | 9.7 | 9.6 | 10.2 |
| BaO | 0.1 | 0.1 | 0.1 | 0.1 | 2.0 | 4.0 | 0.1 | 0.1 | 0.1 |
| RO | 14.1 | 16.1 | 14.4 | 13.9 | 17.2 | 18.3 | 14.4 | 14.4 | 14.8 |
| $B_2O_3$ | 8.4 | 6.6 | 8.5 | 8.5 | 6.4 | 6.4 | 9.9 | 11.4 | 9.9 |
| $Al_2O_3$ | 9.3 | 9.3 | 10.0 | 10.5 | 8.6 | 8.6 | 9.3 | 9.3 | 9.9 |
| $SiO_2$ | 68.1 | 67.8 | 67.0 | 66.9 | 67.6 | 66.5 | 66.2 | 64.8 | 65.2 |
| $SnO_2$ | 0.16 | 0.18 | 0.18 | 0.18 | 0.17 | 0.17 | 0.17 | 0.17 | 0.17 |
| Tstr | 668 | 674 | 668 | 673 | 667 | 665 | 658 | 649 | 659 |
| α | 40.9 | 42.8 | 41.7 | 41.8 | 45.9 | 46.6 | 42.1 | 42.5 | 42.3 |
| ρ | 2.59 | 2.65 | 2.59 | 2.59 | 2.72 | 2.77 | 2.58 | 2.58 | 2.59 |
| T200 | 1595 | 1595 | 1594 | 1610 | 1563 | 1545 | 1569 | 1540 | 1555 |
| Tliq | 1125 | 1125 | 1135 | 1150 | 1100 | 1075 | 1075 | 1070 | 1080 |
| ηliq (kP) | 142 | 162 | 119 | 121 | 124 | 235 | 274 | 202 | 253 |

TABLE 7

| Example Mole % | 58 | 59 | 60 | 61 | 62 |
|---|---|---|---|---|---|
| MgO | 0.1 | 0.1 | 1.6 | 0.1 | 0.1 |
| CaO | 4.6 | 5.0 | 4.9 | 6.5 | 8.0 |
| SrO | 9.5 | 9.8 | 8.4 | 8.5 | 6.9 |
| BaO | 0.1 | 0.1 | 0.1 | 0.1 | 0.1 |
| RO | 14.2 | 15.0 | 15.0 | 15.1 | 15.1 |
| $B_2O_3$ | 11.5 | 10.4 | 10.3 | 10.3 | 10.4 |
| $Al_2O_3$ | 10.0 | 9.7 | 9.6 | 9.6 | 9.6 |
| $SiO_2$ | 64.1 | 64.9 | 65.0 | 64.8 | 64.8 |
| $SnO_2$ | 0.17 | 0.16 | 0.16 | 0.16 | 0.16 |
| Tstr | 656 | 655 | 653 | 657 | 656 |
| α | 42.4 | 42 | 41.8 | 42 | 42.5 |
| ρ | 2.59 | 2.60 | 2.56 | 2.57 | 2.55 |
| T200 | 1528 | 1539 | 1546 | 1539 | 1536 |
| Tliq | 1080 | 1090 | 1100 | 1100 | 1080 |
| ηliq (kP) | 163 | 132 | 136 | 106 | 178 |

It will be apparent to those skilled in the art that various modifications and variations can be made to the present invention without departing from the spirit or scope of the invention. Thus, it is intended that the present invention cover the modifications and variations of this invention provided they come within the scope of the appended claims and their equivalents.

What is claimed is:

1. A glass comprising, in mole percent:

| 58-62% | $SiO_2$; |
|---|---|
| 8-13% | $Al_2O_3$; |
| 6-12% | $B_2O_3$; |
| 0-7% | MgO; |
| 0-12% | SrO; |
| 0-16% | CaO; and |
| 2-9% | BaO, | wherein MgO+CaO+BaO+SrO is greater than 14 to 20 percent, and wherein the glass is substantially free of alkali metal, and wherein the glass is characterized by a liquidus temperature of 1150° C. or lower.

2. The glass according to claim 1, comprising 2-11% CaO.

3. The glass according to claim 1, comprising 2-3.6% BaO.

4. The glass according to claim 1, wherein the glass has a liquidus viscosity of 100,000 poise or greater.

5. The glass according to claim 1, wherein MgO+CaO+BaO+SrO is 16 to 20 percent.

6. The glass according to claim 1, having a coefficient of thermal expansion in the range of from about $35 \times 10^{-7}/°$ C. to about $50 \times 10^{-7}/°$ C.

7. The glass according to claim 1, comprising 0 to about 2 mole percent of $TiO_2$, MnO, ZnO, $Nb_2O_5$, $Ta_2O_5$, $ZrO_2$, $La_2O_3$, $Y_2O_3$, $P_2O_5$, or a combination thereof.

8. The glass according to claim 1, wherein the glass is in the form of a sheet.

9. The glass according to claim 1, comprising 62 mole % $SiO_2$.

10. The glass according to claim 1, comprising, in mole percent:

| | |
|---|---|
| 62% | $SiO_2$; |
| 11.1% | $Al_2O_3$; |
| 10.7% | $B_2O_3$; |
| 4.6% | MgO; |
| 3.6% | SrO; |
| 5.4% | CaO; and |
| 2.4% | BaO. |

11. The glass according to claim 1, comprising, in mole percent:

| | |
|---|---|
| 62% | $SiO_2$; |
| 10.3% | $Al_2O_3$; |
| 10.1% | $B_2O_3$; |
| 4.2% | MgO; |
| 2.9% | SrO; |
| 5.6% | CaO; and |
| 4.9% | BaO. |

12. The glass according to claim 1, comprising, in mole percent:

| | |
|---|---|
| 62% | $SiO_2$; |
| 10.8% | $Al_2O_3$; |
| 10.4% | $B_2O_3$; |
| 4.4% | MgO; |
| 3.3% | SrO; |
| 5.5% | CaO; and |
| 3.7% | BaO. |

13. A photovoltaic device comprising the glass according to claim 1.

* * * * *

UNITED STATES PATENT AND TRADEMARK OFFICE
CERTIFICATE OF CORRECTION

| | | |
|---|---|---|
| PATENT NO. | : 9,643,883 B2 | Page 1 of 1 |
| APPLICATION NO. | : 14/615916 | |
| DATED | : May 9, 2017 | |
| INVENTOR(S) | : Bruce Gardiner Aitken et al. | |

It is certified that error appears in the above-identified patent and that said Letters Patent is hereby corrected as shown below:

On the Title Page

Item (72) Inventors: "James Edward Dickinson" should be corrected to --James Edward Dickinson, Jr.--

Signed and Sealed this
Twenty-sixth Day of June, 2018

Andrei Iancu
*Director of the United States Patent and Trademark Office*